United States Patent
Huy et al.

(10) Patent No.: US 8,084,088 B2
(45) Date of Patent: Dec. 27, 2011

(54) METHOD OF IMPROVING THE WAFER-TO-WAFER THICKNESS UNIFORMITY OF SILICON NITRIDE LAYERS

(75) Inventors: Katja Huy, Dresden (DE); Hartmut Ruelke, Dresden (DE); Michael Turner, San Antonio, TX (US)

(73) Assignee: Globalfoundries Inc., Grand Cayman (KY)

( * ) Notice: Subject to any disclaimer, the term of this patent is extended or adjusted under 35 U.S.C. 154(b) by 2223 days.

(21) Appl. No.: 10/881,932

(22) Filed: Jun. 30, 2004

(65) Prior Publication Data
US 2005/0026434 A1    Feb. 3, 2005

(30) Foreign Application Priority Data
Jul. 31, 2003   (DE) .................... 103 35 099

(51) Int. Cl.
*C23C 16/00* (2006.01)
(52) U.S. Cl. ........ 427/255.394; 427/255.28; 427/255.23
(58) Field of Classification Search .................. None
See application file for complete search history.

(56) References Cited

U.S. PATENT DOCUMENTS

| | | | |
|---|---|---|---|
| 4,822,450 A * | 4/1989 | Davis et al. ............... | 438/709 |
| 4,987,856 A * | 1/1991 | Hey et al. ................ | 118/723 E |
| 6,103,639 A | 8/2000 | Chang et al. .............. | 438/778 |
| 6,261,951 B1 | 7/2001 | Buchwalter et al. ....... | 438/644 |
| 6,593,653 B2 | 7/2003 | Sundararajan et al. ..... | 257/751 |
| 2001/0011725 A1 | 8/2001 | Sakama et al. ............ | 257/59 |
| 2003/0049390 A1* | 3/2003 | Shanmugasundram et al. .................... | 427/585 |
| 2003/0132510 A1 | 7/2003 | Barth et al. .............. | 257/637 |

* cited by examiner

*Primary Examiner* — Michael Cleveland
*Assistant Examiner* — Michael G Miller
(74) *Attorney, Agent, or Firm* — Williams, Morgan & Amerson

(57) ABSTRACT

Wafer-to-wafer thickness uniformity may be improved significantly in a process for depositing a silicon nitride layer in that the flow rate of the reactant and the chamber pressure are varied during a deposition cycle. By correspondingly adapting the flow rate and/or the chamber pressure before and after the actual deposition step, the process conditions may be more effectively stabilized, thereby reducing process variations, even after non-deposition phases of the deposition tool, such as a preceding plasma clean process or an idle period of the tool.

24 Claims, 2 Drawing Sheets

METHOD OF IMPROVING THE WAFER-TO-WAFER THICKNESS UNIFORMITY OF SILICON NITRIDE LAYERS

BACKGROUND OF THE INVENTION

1. Field of the Invention

The present invention generally relates to the field of fabricating microstructures, such as integrated circuits, and, more particularly, to the deposition of silicon nitride layers by chemical vapor deposition (CVD).

2. Description of the Related Art

During the fabrication of microstructures, such as integrated circuits, one important process technology is the deposition of dielectric films for various purposes, such as electrically insulating certain device areas, forming a dielectric for capacitors, providing a barrier function against diffusion of undesired materials, creating a desired etch selectivity with respect to other materials, and the like. Especially, in the field of integrated circuit fabrication, a large amount of presently available products is based on silicon, and, hence, the dielectric materials silicon dioxide and silicon nitride are frequently used for the above-identified purposes due to their superior compatibility with silicon. While silicon dioxide is frequently used as an insulation layer separating, for instance, conductive silicon regions from each other due to the thermal stability of the dioxide/silicon interface, silicon nitride is often used as a barrier material, an etch stop layer for patterning a silicon dioxide layer or a stop layer during the chemical mechanical polishing of silicon dioxide. Silicon nitride ($Si_3N_4$) is a hard, dense, refractory material, the structure of which is quite different from that of silicon dioxide. Silicon nitride is harder, has higher stress levels and cracks more readily than silicon dioxide owing to the differences in structure between the silicon/nitrogen bonds and the silicon/oxygen bonds. Due to the dense structure of silicon nitride, other atoms and ions diffuse very slowly through silicon nitride. As a result, silicon nitride is frequently used as a barrier material to prevent the oxidation of underlying layers or the diffusion of metal ions, such as copper, through sensitive device areas. Moreover, silicon nitride layers are frequently used as etch stop layers in both wet etch and plasma etch processes. Even though silicon nitride usually contains a moderately high amount of hydrogen, which may reach up to approximately 20 atomic percent for silicon nitride deposited by plasma enhanced CVD and several atomic percent for silicon nitride deposited by thermal CVD, the diffusion of hydrogen is also effectively hindered by the dense structure of silicon nitride. The characteristics of silicon nitride, such as its hardness or the optical properties represented by its refractive index, significantly depend on the specifics of the deposition process, especially when a plasma enhanced CVD process is employed, so that desired layer characteristics may be obtained by correspondingly selecting the process parameters for a deposition recipe. For instance, a varying amount of oxygen may be provided during the deposition of silicon nitride so as to obtain a silicon oxynitride, the properties of which may be fairly continuously varied from those of the pure oxide to those of the pure (hydrogenated) nitride.

From the above, it is evident that silicon nitride layers may serve a plurality of purposes in fabricating microstructures and hence corresponding process tools and process recipes have been established to provide silicon nitride layers with a required layer thickness and with desired mechanical, electrical and optical characteristics. A typical deposition regime for producing a silicon nitride layer is chemical vapor deposition, wherein one or more substrates are introduced in a process chamber and exposed to a deposition atmosphere in which appropriate precursors react under specified thermal conditions so as to form a silicon nitride layer with specified characteristics on the substrate. Frequently used precursors are, for instance, dichlorosilane ($SiCl_2H_2$) or silane ($SiH_4$), wherein ammonia ($NH_3$) or pure nitrogen is used as an oxidant. Typically, a temperature is within approximately 700-800° C. at a pressure of approximately 1 Torr. It turns out, however, that silicon nitride thermal CVD processes with temperatures below 600° C. are unavailable and therefore plasma enhanced chemical vapor deposition (PECVD) has become a standard technique for forming silicon nitride layers from the above-specified precursors at temperatures in the range of approximately 200-400° C.

FIG. 1 represents a schematic sketch of a deposition tool that may be used for plasma enhanced CVD deposition for forming various layers, especially for forming a silicon nitride layer on a substrate. In FIG. 1, a deposition tool 100 comprises a process chamber 101, containing therein a shower head 102, connected to a precursor supply line 105 and to coolant supply and exhaust lines 106. The lines 106 may be connected to an appropriate coolant source (not shown) so as to allow temperature control of the shower head 102 during the operation of the deposition tool 100. The precursor supply line 105 is connected to a precursor source 107, including a plurality of precursor gases that are suitable for forming a silicon nitride layer. For instance, the precursor source 107 may comprise a source of dichlorosilane or silane for delivering silicon and an ammonia or nitrogen source as an oxidant or reactant. Furthermore, the precursor source 107 may comprise a precursor for reactive etch chemistry on the basis of hydrogenated fluorides (HF) or carbon fluorides ($C_xF_y$) so as to establish a cleaning atmosphere within the process chamber 101, as will be described in more detail later on. The shower head 102 may comprise an upper electrode 104 connected to a plasma excitation means 108, which is also connected to a second electrode provided in the form of a substrate holder 109. The shower head 102 further comprises a porous surface 103 having formed therein a plurality of passageways so as to substantially uniformly provide precursor ions and molecules to a substrate 110 disposed on the substrate holder 109. Typically, the substrate holder 109 further includes a heater 111 in thermal contact with the substrate 110, thereby allowing a certain degree of temperature control of the substrate 110 during operation. Finally, the process chamber 101 comprises outlets 112 that may be connected to appropriate vacuum sources, such as vacuum pumps, to discharge deposition byproducts and to establish a required pressure within the process chamber 101.

During operation of the deposition tool 100, a required amount of precursor gases is fed to the shower head 102 by controlling the respective flow rates of each of the precursor gases, wherein the plasma excitation means 108 is energized so as to provide a respective AC power to the electrode 104 and the substrate holder 109, thereby generating a certain amount of reactive ions and molecules that are distributed relatively uniformly across the substrate 110 by means of the porous surface 103. Without describing any details of the deposition kinetics, it should be noted, however, that the finally achieved characteristics of the silicon nitride film deposited on the substrate 110 strongly depend on the process parameters, such as the geometry of the shower head 102 and the process chamber 101, the temperature of the shower head 102, the temperature of the substrate 110 (which might not necessarily be identical to the temperature of the heater 111), the pressure within the process chamber 101, the flow rates of the individual precursor gases, the RF power supplied by the plasma excitation means 108, and the like. As previously explained, substantially uniform characteristics of the silicon nitride layer should be obtained across the substrate 110 and should also be obtained for a plurality of substrates that are processed subsequently in the deposition tool 100. That is, mechanical, electrical and optical characteristics, as well as the finally obtained layer thickness of the silicon nitride layer, have to be as uniform as possible for a plurality of substrates so as to meet the restrictive requirements of modern fabrication techniques of microstructures.

During operation of the deposition tool 100, it may be necessary to clean the process chamber 101 on a regular basis so as to provide substantially similar processing conditions for a plurality of substrates. During the deposition of the silicon nitride layer, non-negligible amounts of silicon nitride and possibly of other byproducts may also be deposited on the chamber walls of the process chamber 101. These byproducts may accumulate over time and significantly influence the processing conditions within the chamber 101 for subsequently processed substrates. For example, an increasing layer thickness deposited on the chamber walls may change the radiation behavior of the walls, thereby possibly sensitively influencing the amount of heat transferred to the substrate 110 by heat radiation. Since the actual surface temperature of the substrate 110 may significantly influence the layer characteristics and/or the deposition rate, substrate-to-substrate uniformity may deteriorate as the number of processed substrates increases. Moreover, since high energetic particles may also hit the chamber walls during the plasma enhanced deposition process, material accumulated on the chamber walls may be sputtered off and may reach the substrate 110. When the accumulated material reaches a certain thickness on the chamber walls, larger sized particles may delaminate and hit the substrate 110, thereby contaminating certain areas of the substrate 110.

It is, therefore, common practice to periodically clean the process chamber 101 by plasma etching with appropriate cleaning chemicals, thereby effectively removing deposition residue from the chamber walls and the chamber's components, especially from the porous surface 103, so as to reduce the risk of clogging the passageways. The plasma cleaning process may be performed after the processing of a plurality of substrates or may even be performed for each individual substrate. Depending on the selected cleaning regime, a more or less extended time interval may be required to remove the deposition residue. Since the cleaning process typically requires other parameter settings, for instance, with respect to flow rates, pressure chamber, and the like, compared to the actual deposition process, a variation of the layer characteristics may be observed for substrates processed immediately after the plasma cleaning and conditioning compared to substrates processed without a preceding cleaning process. The same holds true for any non-deposition periods of the tool 100, for instance, for any idle periods when the tool 100 is maintained in a standby mode or when a wafer transfer event occurs. Especially in deposition tools having a plurality of shower heads and substrate holders for simultaneously processing a plurality of substrates, frequent wafer transfer activities may contribute to a subtle destabilization of process conditions. Thus, typically, a plurality of test substrates must be processed prior to the processing of actual product substrates so as to maintain the thickness variation of the silicon nitride layers within specified process margins, thereby reducing productivity and tool utilization.

In view of the above-identified problems, there exists a need for an improved technique for operating a deposition tool for producing a silicon nitride film, in which, among other things, the thickness uniformity from substrate to substrate is improved.

SUMMARY OF THE INVENTION

Generally, the present invention is directed to a method enabling an improved control of process parameters during the deposition of a silicon nitride layer after non-deposition periods of the deposition tool. To this end, the flow rate of the reactant and/or the chamber pressure may be varied prior to the actual deposition step so as to enhance the re-establishment of the process conditions as specified by a given process recipe. As previously explained, the temperature of the substrate and the shower head may be significantly changed upon loading a new substrate into the process chamber or by a preceding operation of the deposition tool in an idle mode or a plasma clean mode. By varying the flow rate of the reactant, which represents the main amount of the gaseous precursors of the deposition process, the shower head's temperature may be rapidly re-adjusted to the specified deposition temperature. Similarly, by correspondingly adapting the chamber pressure at a temperature stabilization phase prior to the actual deposition, a significantly more rapid re-establishment of the actual process parameters may be obtained, thereby improving the substrate-to-substrate thickness uniformity without requiring a plurality of test substrates.

According to one illustrative embodiment of the present invention, a method of controlling a thickness variation in depositing a silicon nitride layer on a plurality of substrates comprises establishing a process recipe for a specified chemical vapor deposition tool to deposit a silicon nitride layer having specified characteristics. Furthermore, at least one of the flow rate of a reactant and a pressure within the deposition tool is adjusted before a deposition step to a value other than specified by the deposition recipe.

According to a further illustrative embodiment of the present invention, a method of controlling the thickness variations of silicon nitride deposited on a plurality of substrates by chemical vapor deposition comprises the selection of a process recipe for a specified deposition tool and the establishment of a relationship between the flow rate of a reactant in non-deposition periods in the deposition tool and a layer thickness of at least some of the plurality of substrates. Finally, a reactant flow rate is used on the basis of the relationship during non-deposition periods when one of the pluralities of substrates is processed.

In accordance with yet another illustrative embodiment of the present invention, a method of depositing a silicon nitride layer on a plurality of substrates is provided. The method comprises selecting a specified process recipe for a specified deposition tool. A first substrate is loaded into the deposition tool while a reactant flow rate is increased above a value range specified by the process recipe. The pressure in the deposition tool is then increased above a value range specified by the process recipe. Thereafter, the pressure and the reactant flow rate in the deposition tool are adjusted in accordance with the specified process recipe so as to deposit a silicon nitride layer on the first substrate. Finally, the reactant flow rate is increased above the value range specified by the process recipe while unloading the first substrate and loading a second substrate into the deposition tool.

BRIEF DESCRIPTION OF THE DRAWINGS

The invention may be understood by reference to the following description taken in conjunction with the accompanying drawings, in which like reference numerals identify like elements, and in which.

Figure 1:
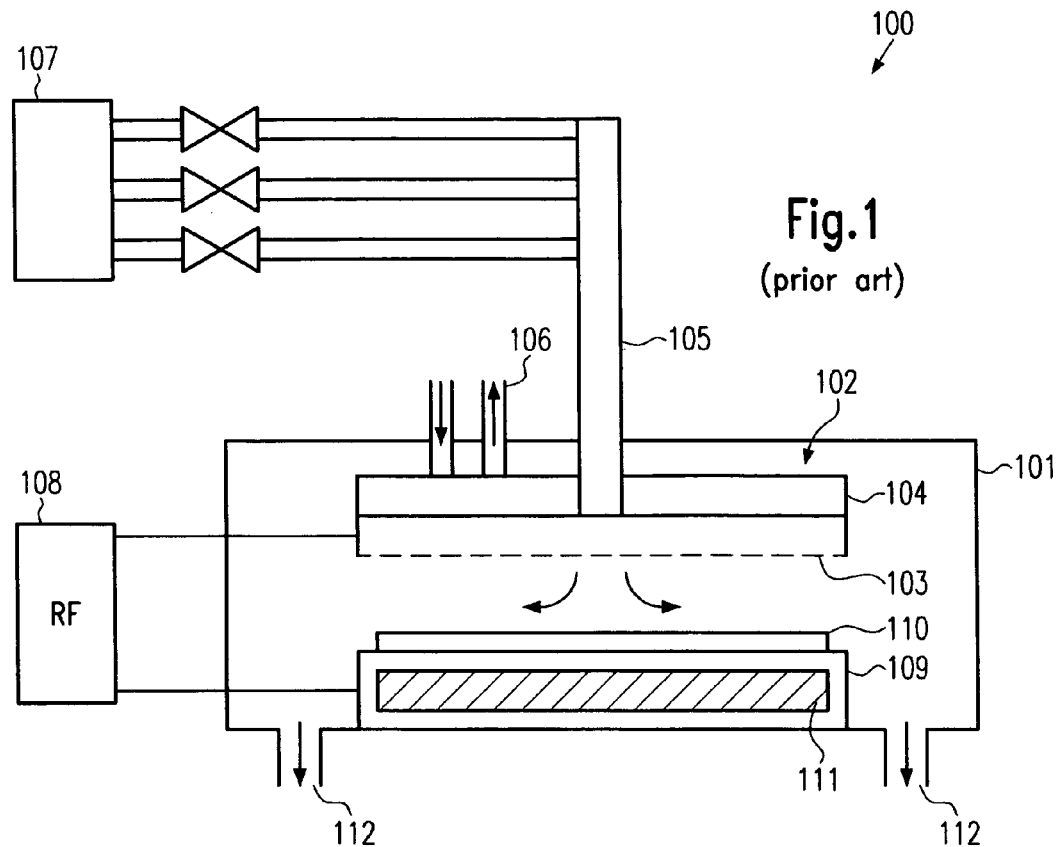
FIG. 1 schematically illustrates a CVD deposition tool that is suitable for performing a plasma enhanced deposition process.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As previously explained, the characteristics of the silicon nitride layers, as well as the substrate-to-substrate thickness uniformity, sensitively depend on the specifics of the deposition atmosphere in combination with the characteristics of the deposition tool used. In FIG. 1, a basic configuration of a CVD deposition tool has been described, and the embodiments described herein may be readily applied to a basic deposition tool 100 designed as shown in FIG. 1. That is, subtle changes in the processing conditions may be at least partially compensated for by correspondingly adapting the flow rate and/or the pressure within the process chamber based on a respective relationship between the thickness uniformity and the non-deposition periods such as plasma cleaning processes, conditioning processes, wafer transfers, temperature stabilization steps and the like. In the following, respective embodiments will be described referring to a more sophisticated deposition tool that allows an enhanced throughput by providing a plurality of process stations that may be configured similarly to the deposition tool 100. The results and embodiments described herein may then be readily applied to any specific deposition tool and deposition recipe on the basis of the teaching provided herein. Hence, the present invention should not be considered as being restricted to the embodiments described hereinafter, unless such restrictions are explicitly put forth in the appended claims.

Figure 2:
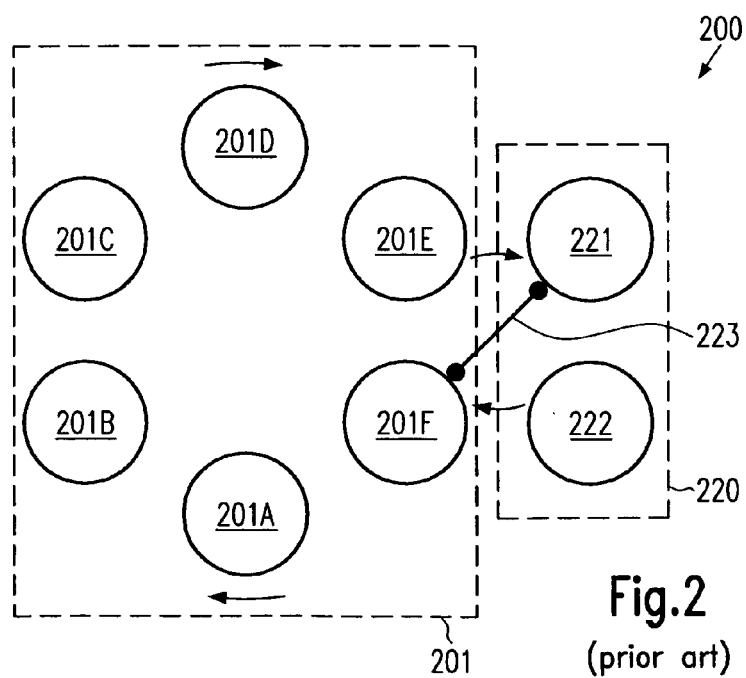
FIG. 2 schematically illustrates a deposition tool for plasma enhanced silicon nitride deposition, available from Novellus, Inc. and containing a plurality of process stations for processing a plurality of substrates.

FIG. 2 schematically illustrates a multi-station CVD tool 200 in a very simplified manner, as available from Novellus, Inc. under the trademark "Sequel." The deposition tool 200 comprises a process chamber 201, including a plurality of individual process stations 201a, . . . 201f, which may be configured to allow the deposition of a required layer, such as a silicon nitride layer. The deposition tool 200 further comprises a substrate transfer station 220, including a substrate handler 223 that is configured so as to provide substrates from a storage member 221, such as a wafer cassette, to one of the process stations 201a, . . . 201f, and to unload a substrate from one of the process stations 201a, . . . 201f to a wafer receiving member 222. The substrate transfer station 220 may comprise a substrate cool station (not shown) so as to reduce the temperature of substrates unloaded by the substrate handler 223 prior to providing the substrates to the storage member 222. Furthermore, each of the process stations 201a, . . . 201f may be equipped with a plasma excitation means that allows the establishment of an appropriate plasma atmosphere for periodically cleaning the individual process stations and to establish a required plasma atmosphere, if a plasma enhanced deposition process is required. As previously explained, in many cases, plasma enhanced silicon nitride deposition is preferred due to the significantly lower process temperatures compared to a thermal silicon nitride chemical vapor deposition. It should be noted, however, that the present invention achieves an improved process control by manipulating process parameters such as the oxidant or reactant flow rate and the chamber pressure without referring to plasma dependent parameters. Consequently, the principles of the present invention may be applied to thermal chemical vapor deposition of silicon nitride as well as plasma enhanced chemical vapor deposition, wherein a corresponding adaptation may be readily achieved on the basis of the teachings provided herein. Thus, the present invention should not be considered as limited to use with any particular process unless such limitations are expressly set forth in the appended claims.

During operation of the deposition tool 200, substrates may be continuously supplied to the individual process stations 201a, . . . 201f by using a substrate transport mechanism (not shown) and loading respective substrates from the substrate cassette 221 to the process chambers accessible by the substrate handler 223. Depending on the mode of operation, substrates may be continuously unloaded by the handler 223 and conveyed to the storage member 222. The process recipe is selected such that the mechanical, electrical, optical and other characteristics of the silicon nitride layer, especially the thickness thereof, are obtained within a range dictated by design requirements. Preferably, a maximum variation of the thickness may be kept below approximately 1.5%. The process recipe required for obtaining the specified characteristics may be obtained by experiment, wherein, typically, a library of recipes has been established and may be stored in a corresponding database that allows the ready retrieval of a specific process recipe for a certain deposition tool when a specific silicon nitride layer has to be formed. As previously pointed out, a plasma cleaning process and conditioning process is required on a regular basis, wherein, immediately after the plasma cleaning, a subtle change in processing conditions may occur in one or more of the plurality of process stations $201a, \ldots 201f$, so that one or more of the characteristics of the silicon nitride may differ from that of other substrates that were previously processed. A corresponding variation of layer characteristics may be caused by, for instance, a slight temperature variation of the shower heads, which may have experienced a different precursor gas flow rate and chamber pressure during the plasma clean compared to the actual deposition step.

Figure 3:
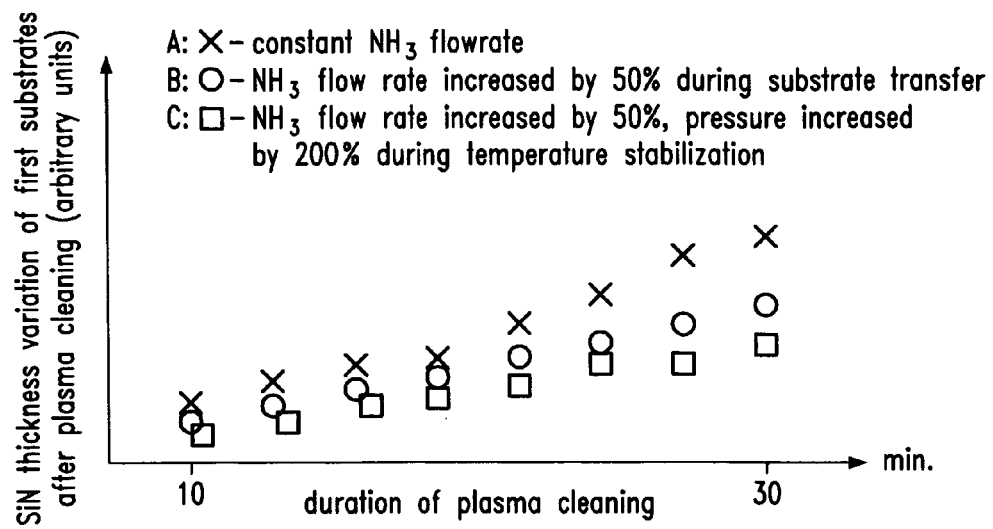
FIG. 3 schematically represents a graph depicting a relationship between the silicon nitride thickness variation of a specified number of substrates processed immediately after plasma cleaning processes of varying duration according to illustrative embodiments of the present invention.

FIG. 3 schematically represents a graph that shows the thickness variation for a silicon nitride layer formed on the first six substrates processed in the deposition tool 200 after completion of a preceding plasma cleaning process, wherein the plasma cleaning recipe, i.e., type of reactive and carrier precursors, flow rates, chamber pressure, RF power, and the like, is substantially maintained for all measurements and the duration of the plasma cleaning process is varied. For instance, for a given plasma clean chemistry, the duration of the cleaning process may be varied from approximately 10-30 minutes. A Curve A in FIG. 3 may represent corresponding measurement values, wherein, during the whole deposition cycle, including substrate transfers, temperature stabilization and actual silicon nitride deposition, the flow rate of the reactant, in the present example ammonia ($NH_3$), is constantly maintained. Other appropriate reactants may include nitrogen. Although FIG. 3 is only to be considered as a qualitative illustration of the measurement results, it is evident that a thickness variation may be observed, which still increases as the duration of the plasma cleaning process increases. For instance, for a silicon nitride layer having a design thickness of 100 nm on a blanket silicon substrate, a thickness variation may be observed in the range of approximately 1.5-3% as is qualitatively shown by Curve A. Conventionally, significant silicon nitride thickness variations, especially at the beginning of a deposition cycle after a plasma cleaning process and a conditioning, are taken into account by processing a plurality of test substrates so as to sufficiently stabilize the deposition conditions.

According to one illustrative embodiment of the present invention, a relationship is established based on the inventor's concept that a flow rate variation and/or a pressure re-adjustment during non-deposition periods may assist in stabilizing the deposition conditions, even for substrates immediately processed after tool idle periods or plasma cleaning processes. Consequently, a plurality of experiments has been performed so as to determine a dependence of the silicon nitride thickness variation from the corresponding reactant flow rate. Curve B in FIG. 3 illustrates representatively corresponding results and qualitatively describes the corresponding dependence when the reactant, e.g., ammonia, flow rate is varied during at least some phases of the entire deposition cycle, which may effect the corresponding silicon nitride thickness variation. In Curve B, the reactant flow rate (in the present example, the ammonia flow rate) is increased by approximately 50% with respect to the ammonia flow rate specified by the process recipe during non-deposition periods of the deposition cycle. That is, during substrate transfer and during a period for temperature stabilization of the substrate, the ammonia flow rate is increased by 50% and is then ramped down to the specified deposition value prior to initiating the silicon nitride deposition by introducing the silicon-containing precursor into the respective process station. Without restricting the present invention to the following explanation, it is assumed that, after plasma cleaning of the process stations, the shower head temperature may be increased, which may give rise to an increased thickness variation in the conventional process flow, employing a substantially constant ammonia flow rate. In the present invention, however, it is assumed that the increased reactant flow rate during the wafer transfer and the temperature stabilization step may correspondingly cool down the shower head and thus promote a rapid stabilization of the processing conditions prior to the actual deposition step. As indicated in FIG. 3, a significant reduction in the thickness variation may be obtained by correspondingly varying the ammonia flow rate during the deposition cycle. Respective dependencies may be obtained for a plurality of flow rate variations for given process and plasma cleaning recipes so as to effectively control the shower head temperature on the basis of the experiments.

In a further embodiment, it is contemplated that the chamber pressure may also have an influence on the efficiency in re-establishing the deposition conditions so as to minimize silicon nitride thickness variations. Curve C in FIG. 3 shows one representative example, in which the ammonia flow rate is adjusted as previously described with reference to Curve B, whereas the chamber pressure is increased by approximately 200% with respect to the actual deposition pressure after the wafer transfers and prior to the actual deposition step. As indicated in FIG. 3, even for extremely extended plasma cleaning processes, the silicon nitride thickness variation for the first substrates processed may be significantly lowered, thereby possibly eliminating the necessity for processing a plurality of test wafers prior to actual product substrates. Corresponding relationships may be established for a plurality of process recipes and these process recipes may then be correspondingly amended or may be associated with the respective relationships when a silicon nitride layer of specified characteristics is to be manufactured on a specific deposition tool. It should be appreciated that a corresponding temperature control of the shower head may also be obtained by lowering the reactant flow rate if the shower head temperature is too low with respect to the actual deposition conditions, which may be the case during idle times of the deposition tool 200. The status of the shower heads during idle times depends on the tool setting and may be monitored by corresponding temperature readings. Thus, corresponding relationships, as representatively shown in FIG. 3, may also be established for idle periods of the deposition tool 200. From the specific idle conditions of the tool, as explained with reference to FIG. 3, corresponding relationships may then be established for a plurality of process recipes and may be associated thereto so that the finally performed deposition cycle depends on the specified process recipe and the current tool status that may be characterized by an idle period prior to deposition, a plasma clean process of a specified duration prior to the deposition, a non-interrupted deposition, and the like. Hence, in one particular embodiment, a deposition cycle for a substrate, i.e., a sequence including substrate transfer, temperature stabilization, deposition and substrate transfer, is set up on the basis of a specified process recipe, the current tool status and one or more relationships associated with the specified process recipe and the currently valid tool status. A corresponding set-up of the deposition cycle may be carried out by an operator or may be performed automatically by correspondingly setting up a recipe management system database, which may take into account the above by, for example, maintaining a plurality of process recipe variations for the same silicon nitride layer, wherein the various variations relate to the currently valid tool status.

Figure 4:
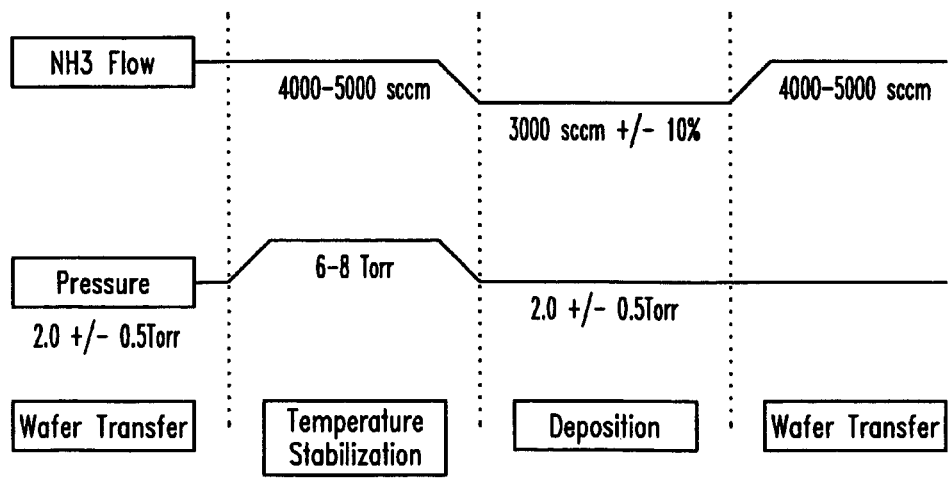
FIG. 4 schematically represents a process flow in accordance with one illustrative embodiment of the present invention.

FIG. 4 schematically illustrates a process flow for depositing a silicon nitride layer by means of the deposition tool 200, wherein the reactant flow rate and the pressure are varied during the deposition cycle so as to reduce thickness variations which would be obtained during the conventional operation mode of the deposition tool 200. In FIG. 4, it is assumed that the current tool status is classified as "non-interrupted" deposition, wherein, for instance, the wafer transfer actions may lead to process instabilities owing to, for example, temperature fluctuations due to the loading of cool substrates into respective process stations. As previously noted, a corresponding adaptation of the reactant flow rate and/or the chamber pressure may assist in more effectively thermally "decoupling" the corresponding shower head from the low temperature of the freshly introduced substrate. Thus, the actual process recipe may be associated with a respective flow rate and/or pressure variation as indicated by the tool status, wherein the values for the variations may have been established on the basis of the above-explained dependencies. In the embodiment shown in FIG. 4, a first period indicated as "wafer transfer" is performed at a chamber pressure of 2.0±0.5 Torr, which represents the pressure as dictated by the corresponding deposition recipe. During the wafer transfer phase, the ammonia flow rate is adjusted to approximately 4000-5000 sccm. The duration of the wafer transfer period may range from about 5-15 seconds for the above-identified Novellus tool.

In a second period, indicated as "temperature stabilization," the ammonia flow rate is still maintained at the increased value, and the pressure is raised to approximately 6-8 Torr so as to effectively enhance the temperature stabilization of the substrate and the shower head. The temperature stabilization step may last for approximately 10-30 seconds, wherein, at a final phase, for instance, of approximately five seconds, the ammonia flow rate is decreased to the value range as specified by the process recipe and simultaneously the chamber pressure is lowered to the specified deposition value. Thus, during the deposition phase, the required deposition conditions are established, i.e., a reactant flow rate of approximately 2800-3200 sccm and a pressure of approximately 2.0±0.5 Torr, wherein the preceding adaptation of the flow rate and the chamber pressure lead to a faster approach to the actual process conditions, thereby significantly lowering thickness variations of the silicon nitride layer when a plurality of substrates is processed sequentially. At the end of the deposition phase, the ammonia flow rate is increased to approximately 4000-5000 sccm and the substrate is transferred to a subsequent station or to the outside, while the pressure is still at the deposition value range. For a deposition cycle as shown in FIG. 4, the thickness variation may be lowered by approximately 50% compared to a standard process cycle with a substantially constant flow rate and chamber pressure throughout the entire process.

Although the preceding deposition cycle may also lead to a significant reduction of thickness variations when employed for any tool status other than a "regular" deposition sequence, in other embodiments, it may be considered appropriate to use other cycles with respective flow rates and/or pressure variations during the entire deposition cycle for each specified tool status. That is, when the deposition cycle is to be performed immediately after a plasma cleaning process, corresponding flow rate and/or pressure values may be used as previously established in a corresponding relation and assigned to this tool status. The same holds true for a deposition cycle immediately performed after an idle period of the deposition tool 200.

As previously explained, the concept of the present invention may be applied to a thermal CVD process and may also be applied to a plasma enhanced deposition cycle, wherein the corresponding flow rate and/or pressure values may be obtained by correspondingly established relationships as explained with reference to FIG. 3.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of controlling a thickness variation in depositing a silicon nitride layer on a plurality of substrates, the method comprising:
   establishing a process recipe for a specified chemical vapor deposition tool to obtain the silicon nitride layer having specified characteristics;
   adjusting at least one of a flow rate of a reactant and a pressure within the deposition tool prior to a deposition step to a value other than specified by said deposition recipe;
   operating the deposition tool using said at least one adjusted flow rate or adjusted pressure prior to the deposition step; and
   returning said at least one adjusted flow rate or adjusted pressure to the values specified by the process recipe after said operation and prior to the deposition step.

2. The method of claim 1, wherein at least one of a flow rate of a reactant and a pressure within the deposition tool is adjusted after the deposition step to a value other than specified by said deposition recipe.

3. The method of claim 1, further comprising performing a plasma clean process in said deposition tool and increasing, in response to performance of the plasma clean process, a flow rate of said reactant and a chamber pressure compared to the corresponding values specified in said process recipe prior to depositing the silicon nitride layer to modify at least one temperature in the deposition tool.

4. The method of claim 1, further comprising loading a first substrate into said deposition tool while applying an increased flow rate of the reactant compared to the value specified in said process recipe.

5. The method of claim 4, further comprising increasing a pressure in said deposition tool from a value specified by said process recipe and maintaining the increased pressure for a specified time interval.

6. The method of claim 5, further comprising increasing the flow rate of said reactant after completion of the deposition of the silicon nitride layer.

7. The method of claim 6, wherein the pressure in said deposition tool is maintained substantially constant when increasing the flow rate after completion of the deposition.

8. The method of claim 1, wherein said reactant is comprised of ammonia.

9. The method of claim 1, wherein said reactant flow rate during the deposition step is in the range of approximately 2800-3200 sccm.

10. The method of claim 9, wherein said reactant flow rate is increased to a range of approximately 4000-5000 sccm prior to the deposition step.

11. The method of claim 10, wherein said reactant flow rate is increased to a range of approximately 4000-5000 sccm after the deposition step.

12. The method of claim 1, wherein a pressure is in the range of approximately 1.5-2.5 Torr during the deposition step.

13. The method of claim 12, wherein a pressure is increased to approximately 6-8 Torr prior to the deposition step.

14. The method of claim 12, wherein the pressure in said deposition tool is substantially maintained at the value specified by said process recipe during transfer of the first substrate into the deposition tool.

15. The method of claim 14, further comprising increasing the pressure in said deposition tool for a predefined time interval so as to stabilize a temperature of a showerhead of the deposition tool.

16. A method of controlling thickness variations of silicon nitride deposited on a plurality of substrates by chemical vapor deposition, the method comprising:
    selecting a process recipe for a specified deposition tool;
    establishing a relationship between a flow rate of a reactant during non-deposition periods in said deposition tool and a thickness of a layer formed on at least some of the plurality of substrates during at least one deposition period in which the deposition tool operates according to the process recipe, said at least one deposition period following at least one of the non-deposition periods; and
    introducing a reactant at a reactant flow rate that is based on said relationship during at least one non-deposition period in processing one of the plurality of substrates in said deposition tool.

17. The method of claim 16, further comprising specifying respective pressure ranges on the basis of said relationship for at least two different non-deposition periods so as to minimize a thickness variation of the silicon nitride layers of the at least some of the plurality of substrates, the silicon nitride layers being formed during said at least one deposition period in which the deposition tool operates according to the process recipe.

18. The method of claim 17, wherein said at least two non-deposition periods include a time interval immediately after a plasma cleaning process of said deposition tool and a substrate transfer operation.

19. The method of claim 18, wherein said at least two non-deposition periods include an idle status of said deposition tool.

20. The method of claim 18, wherein the reactant flow rate is increased compared to a value specified by said process recipe during transfer of a first substrate into the deposition tool.

21. The method of claim 17, wherein said reactant is comprised of ammonia.

22. A method of depositing a silicon nitride layer on a plurality of substrates, the method comprising:
    selecting a process recipe for a specified deposition tool;
    loading a first substrate into the deposition tool while increasing a reactant flow rate above a value range specified by said process recipe;
    increasing a pressure in said deposition tool above a value range specified by said process recipe;
    adjusting the pressure and the reactant flow rate in said deposition tool in accordance with said specified process recipe so as to deposit a silicon nitride layer on the first substrate; and
    increasing said reactant flow rate above the value range specified by said process recipe while unloading the first substrate and loading a second substrate into the deposition tool.

23. The method of claim 22, further comprising plasma cleaning said deposition tool prior to loading the first substrate into the deposition tool.

24. The method of claim 22, wherein said first substrate is processed immediately after an idle period of said deposition tool.

* * * * *